US006225032B1

(12) United States Patent
Hasegawa et al.

(10) Patent No.: US 6,225,032 B1
(45) Date of Patent: May 1, 2001

(54) METHOD FOR MANUFACTURING LIQUID JET RECORDING HEADS AND A HEAD MANUFACTURED BY SUCH METHOD OF MANUFACTURE

(75) Inventors: Toshinori Hasegawa, Yokohama; Masaki Inaba, Kawasaki; Akio Saitoh, Machida; Akira Goto, Yokohama; Masao Furukawa, Yokohama; Shin Ishimatsu, Yokohama; Miki Ito, Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/139,399

(22) Filed: Aug. 25, 1998

(30) Foreign Application Priority Data

Aug. 27, 1997 (JP) .......... 9-246062

(51) Int. Cl.[7] .......... G03F 7/00

(52) U.S. Cl. .......... 430/320; 430/323; 430/945; 216/27

(58) Field of Search .......... 430/311, 320, 430/323, 945; 216/27; 427/96

(56) References Cited

U.S. PATENT DOCUMENTS

| | | | | |
|---|---|---|---|---|
| 3,632,398 | | 1/1972 | Konig | 117/93.3 |
| 3,866,398 | | 2/1975 | Vernon, Jr. et al. | 156/17 |
| 4,313,124 | | 1/1982 | Hara | 346/140 R |
| 4,345,262 | | 8/1982 | Shirato et al. | 346/140 R |
| 4,459,600 | | 7/1984 | Sato et al. | 346/140 R |
| 4,463,359 | | 7/1984 | Ayata et al. | 346/1.1 |
| 4,558,333 | | 12/1985 | Sugitani et al. | 346/140 R |
| 4,608,577 | | 8/1986 | Hori | 346/140 R |
| 4,723,129 | | 2/1988 | Endo et al. | 346/1.1 |
| 4,740,796 | | 4/1988 | Endo et al. | 346/1.1 |
| 4,826,711 | * | 5/1989 | Yamazaki et al. | 427/248.1 |
| 5,103,284 | * | 4/1992 | Ovshinsky et al. | 257/64 |
| 5,365,255 | * | 11/1994 | Inoue et al. | 347/45 |
| 5,443,687 | * | 8/1995 | Koyama et al. | 216/27 |
| 5,576,925 | * | 11/1996 | Gorowitz et al. | 361/301.2 |

FOREIGN PATENT DOCUMENTS

| | | |
|---|---|---|
| 0 576 007 | 12/1993 | (EP) . |
| 0 680 804 | 11/1995 | (EP) . |
| 0 771 659 | 5/1997 | (EP) . |
| 54-56847 | 5/1979 | (JP) . |
| 59-123670 | 7/1984 | (JP) . |
| 59-138461 | 8/1984 | (JP) . |
| 60-71260 | 4/1985 | (JP) . |
| 4-279355 | 10/1992 | (JP) . |
| 4-279356 | 10/1992 | (JP) . |

* cited by examiner

*Primary Examiner*—Kathleen Duda
(74) *Attorney, Agent, or Firm*—Fitzpatrick, Cella, Harper & Scinto

(57) ABSTRACT

A method for manufacturing liquid jet recording heads, each provided with discharge ports to discharge liquid, a discharge port plate having the discharge ports arranged therefor, and performing ablation processing of holes becoming the discharge ports by use of a mask for projecting the image of the mask onto the discharge port plate with coherent laser beam as light source, comprises the following steps of forming water-repellent layer on the surface of the discharge port plate on the liquid discharge side; and of performing the ablation processing by irradiating the laser beam from the reverse side of the surface of discharge port plate having the water-repellent layer formed thereon in a state of such surface being arranged to be under the atmosphere containing fluorine atom, and forming the discharge ports, at the same time, enabling the substance containing the fluorine atom excited by the laser beam to adhere to the surface having the water-repellent layer formed thereon. In this manner, the throughput of product manufacture is enhanced without any provision of extra processing steps to remove the byproducts to be created by the irradiation of laser beam, hence contributing to a significant cost reduction of the manufacture of liquid jet recording heads.

13 Claims, 5 Drawing Sheets

METHOD FOR MANUFACTURING LIQUID JET RECORDING HEADS AND A HEAD MANUFACTURED BY SUCH METHOD OF MANUFACTURE

BACKGROUND OF THE INVENTION

1. Field of the Invention

The present invention relates to a method for manufacturing liquid jet heads whereby to manufacture a resin ceiling plate by means of grooving, drilling, or the like by the irradiation of laser beam. The invention also relates to an apparatus therefor.

2. Related Background Art

The liquid jet recording head, which is used for the liquid jet recording apparatus or the like that records or prints on a recording sheet by discharging ink or other recording liquid from the fine discharge ports (orifices) as flying droplets, is provided with an elemental substrate (heater board) having on it a plurality of discharge energy generating devices (electrothermal converting elements, for example) and lead electrodes therefor as well. On this elemental substrate, a resin nozzle layer (liquid flow path formation layer) is laminated to form the liquid flow paths (nozzles) and a common liquid chamber. Then, it is generally practiced to overlay on it the glass ceiling plate provided with supply tubes of recording liquid. In recent years, however, it has been developed to manufacture a liquid jet recording head in such a manner that while the glass ceiling plate is omitted, the resin ceiling plate is integrally produced with liquid flow path grooves and the common liquid chamber, together with the supply tube of recording liquid, by means of the injection molding or the like, and then, discharge ports are processed for its formation, and then, the ceiling plate is pressed to the elemental substrate by use of elastic member for the integral formation of a head. A liquid jet head of the kind makes it possible to reduce part numbers significantly, and also, makes the assembling processes simpler. Therefore, it is anticipated that the liquid jet recording heads thus developed will contribute to the considerable reduction of costs when liquid jet recording apparatuses are manufactured using such heads.

FIG. 7 shows the principal part of the liquid jet recording head that uses the resin ceiling plate formed as described above. In FIG. 7, the liquid jet recording head Eo is shown with the resin ceiling plate which is partly broken in its representation. This head is provided with an elemental substrate 101 having a plurality of electrothermal converting elements 101*a* serving as discharge energy generating devices, and the resin ceiling plate 102 having flow path grooves 102*f* each positioned on each of the electrothermal converting elements 101*a*, and also, the common liquid chamber 102 communicated with each of them. For the resin ceiling plate 102, there are arranged integrally, the discharge port plate 102*b* provided with discharge ports (orifices) each communicated with each of the flow path grooves 102*f*, and the cylindrical protrusion 102*d* provided with the liquid supply opening 102 that opens to the common liquid chamber 102*c*.

At first, the resin ceiling plate is formed integrally by means of the injection molding or the like, with the discharge port plate 102*b* and cylindrical protrusion 102*d*, in addition to the flow path grooves 102*f* and the common liquid chamber, altogether. Then, after the discharge ports 102*g* are processed, the resin ceiling plate 102 is positioned so as to bring each of the flow path grooves 102*f* to be placed exactly on each of the electrothermal converting elements

111*a* on the elemental substrate 101. Thus, by means of the elastic member (not shown), the ceiling plate 102 is pressed to the elemental substrate 101 to be bonded together. In this respect, the elemental substrate 101 is fixed on a base plate 104 by means of screws or some other known means, together with the printed-circuit board 103 having driving circuit provided therefor to generate electric signals to each of the electrothermal converting elements 110*a*.

Also, a method has been developed to manufacture the resin ceiling plate 102 in such a manner that at first, a blank (roughly molded product) is produced by means of the injection molding or the like integrally with the main body portion 102*a* before the flow path grooves are provided, and the discharge port plate 102*b* before the discharge ports 102*g* are formed, and then, by use of the excimer laser beam, each of the flow path grooves 102*f* is processed on the main body portion 102*a*, and likewise, each of the discharge ports 102*g* is drilled on the discharge port plate 102*b*.

In this way, with the molding formation combined with the laser processing, it becomes possible to simplify the preparation of the molding die for processing, as well as the processing itself, because it is not required for the die used for processing the ceiling plate formation to prepare any particular member additionally for the formation of flow path portion. Further, since the laser processing performs its processing in a higher precision at a shorter period of time, the resin ceiling plates are produced at lower costs, thus promoting the reduction of costs still more for the manufacture of liquid jet heads.

Then, as the laser processing apparatus used for grooving and drilling by irradiating the laser beam onto the resin blank which is produced by the injection molding, it is suitable to adopt the one that emits excimer laser. A laser processing apparatus of the kind is generally provided with an excimer laser oscillator serving as the laser light source that emits the excimer laser beam; masks having the patterns of the flow path grooves and openings; and the optical system that projects the opening patterns onto the blank of the ceiling plate by the use of the excimer laser beam.

Now, however, when drilling is made by a technique of the kind for the formation of discharge ports, the byproducts that are created at the time of laser processing and allowed to adhere to the processing surface of the ceiling plate. Then, the surface energy per hour becomes higher on the portions where the byproducts have adhered, and the resultant wettability becomes higher with respect to the recording liquid. In other words, such surface becomes hydrophilic.

In order to enhance the discharge efficiency of the recording liquid at its discharge ports of a liquid jet head, it is desirable to make them water-repellent in order to avoid any stronger interaction between liquid and resin. Particularly, if the circumference of the discharge ports (orifices) of the discharge port plate should become hydrophilic, the smooth discharge of recording liquid is hindered. As a result, image deviation may take place when recording or printing is made on a recording medium, such as recording paper sheet, or the discharge of recording liquid may be disabled, thus presenting critical problems related to the product performance. Therefore, the water-repellent resin is coated on the resin surface. Then, the coated resin is hardened by the application of beam or heat treatment to form the water-repellent layer on the resin surface. Also, depending on the resin material, such water-repellent layer is formed by evaporating the solvent that resolves such resin material or the dispersion medium that disperses it by giving heat treatment.

Therefore, it is important to prevent the resin surface energy from rising due to the byproducts created at the time of laser processing. In order to avoid the rise of resin surface energy due to the adhesion of the byproducts, that is, to prevent the surface from becoming hydrophilic, there is known a technique, such as disclosed in the specification of Japanese Patent Application Laid-Open No. 4-279356, whereby to perform heat treatment, ultrasonic rinsing, ultrasonic water flow rinsing, high pressure water flow rinsing, or the like or to repeat applying adhesive tape and peeling it off so that the byproducts adhering to the circumference of the discharge port (orifices) are removed after the grooves or holes are formed on the resin blank by the irradiation of excimer laser.

Further, as disclosed in the specification of Japanese Patent Application Laid-Open No. 4-279355, there is known a method whereby to remove byproducts in such a manner that at first, resist or the like is coated on the resin surface provisionally, and then, the byproducts are rinsed by use of developer, together with the resist, to remove them all after the grooves and holes are formed on the resin blank by the irradiation of excimer laser.

However, in accordance with the aforesaid technique, the method of removing the byproducts should give heat treatment at a high temperature for a long time such as at 120° C. for an hour after having drilled holes, which serve the liquid discharge ports, by the irradiation of laser beam on the resin blank, or such method should dry the processed resin blank after rinsing it by the application of ultrasonic waves or by use of the ultrasonic water flow. Also, there is a need for a process dedicated to the removable of the byproducts if the adhesion of the byproducts on the surface of the resin blank should be removed by use of the adhesive tapes for peeling off. Also, for the method in which resist is coated in advance, and the byproducts are removed together with the resist by use of the developer, it is necessary to provide a special process to develop the resist and rinse it off after the laser processing.

As described above, therefore, the conventional techniques to remove the byproducts need one special process or another for the execution of the designated treatments, which leads to increasing the costs of manufacture, and also, taking more time in completing the required processes. These affect the production efficiency seriously, thus presenting the problems yet to be solved with respect to the extremely lowered throughput of production.

SUMMARY OF THE INVENTION

Therefore, the present invention is designed in consideration of these problems yet to be solved in the conventional art as described above. It is an object of the invention to provide a method for manufacturing liquid jet recording heads capable of solving without any provision of special processing steps the problem encountered in the conventional art that when the holes are processed to make liquid discharge ports on the resin blank by the irradiation of laser beam, the surface energy of resin is increased due to the adhesion of byproducts to the surface of the blank, thus being made capable of enhancing the throughput of product manufacture. It is also the object of the invention to provide an apparatus to be used therefor.

In order to achieve the aforesaid objectives, the method of the present invention for manufacturing liquid jet recording heads, each provided with discharge ports to discharge liquid and a discharge port plate having the discharge ports by collectively performing ablation processing of holes becoming the discharge ports by use of a mask for projecting the image of the mask onto the discharge port plate with coherent laser beam as light source, comprises the following steps of forming water-repellent layer on the surface of the discharge port plate on the liquid discharge side; and of performing the ablation processing by irradiating the laser beam from the reverse side of the surface of discharge port plate having the water-repellent layer formed thereon in a state of the surface of discharge port plate having the water-repellent layer formed thereon being arranged to be under the atmosphere containing fluorine atom, and forming the discharge ports and enabling the substance containing the fluorine atom excited by the laser beam to adhere to the surface having the water-repellent layer formed thereon.

For the method of the present invention for manufacturing liquid jet heads, it is preferable to use tetrafluoromethane as gas to be blown onto the object to be processed.

Also, for the method of the present invention for manufacturing liquid jet heads, it is preferable to use polytetrafluoroethylene as resin to be located extremely close to the object to be processed.

For the method of the present invention for manufacturing liquid jet heads, it is preferable to use ultraviolet laser, particularly excimer laser as the laser beam therefor.

With the coherent laser beam as the light source, this method uses the mask to project the image thereof onto the roughly molded product, and the holes that become the discharge ports are processed at a time by means of ablation. When ablation is performed by the irradiation of laser beam, it is arranged to carry out the chemical surface modification in a state of atmosphere containing fluorine atom on the byproducts to be created by the irradiation thereof. In this way, it is made possible to suppress the increase of surface energy of the blank caused by the adhesion of the byproducts, hence preventing the surface of the blank from becoming hydrophilic. In other words, it is possible to give treatment of chemical surface modification on the byproducts, while performing the laser beam processing simultaneously. As a result, there is no need for any provision of extra process in order to remove the byproducts. In this manner, the throughput of product manufacture is enhanced to reduce the costs of manufacture accordingly. Further, it becomes possible to implement enhancing the water-repellency to improve the printing quality.

With the gaseous molecules containing fluorine atom in its structure, tetrafluoromethane, for example, being blown to the laser processing part or with the resin that contains fluorine atom in its structure, polytetrafluoroethylene, for example, or the absorbent having the solution with the solvent that contains polymer having fluorine atom in its structure, being placed extremely close to the processing part, highly reactive fluorine atom is created by the irradiation of laser beam. Then, with the fluorine atom thus created, the byproducts caused by the irradiation of laser beam is provided with the chemical surface modification, thus implementing to fluorinate the surface thereof. With such chemical surface modification as to fluorinate the byproducts adhering to the surface of the blank which raises the surface energy thereof, the surface of the discharge port plate is stabilized and allowed to present water-repellency. In this manner, it becomes possible to suppress the occurrence of the phenomenon that the hydrophilicity is created locally due to the adhesion of the byproducts.

Also, using ultraviolet laser, particularly excimer laser beam the discharge ports are processed at a time. With the excellent characteristics of excimer laser when used for a processing of the kind, it becomes possible to manufacture liquid jet recording heads having the stabilized directivity of flying droplets for the performance of high quality printing. Further, it becomes possible to create highly reactive fluorine atom from the substance containing fluorine atom by the application of high energy of the excimer laser beam.

BRIEF DESCRIPTION OF THE DRAWINGS

FIG. 1A is a perspective view which shows the ceiling plate blank integrally formed by means of an injection molding or the like; FIG. 1B is a perspective view which shows the ceiling plate having the flow path grooves and the discharge ports formed by processing.

DETAILED DESCRIPTION OF THE PREFERRED EMBODIMENTS

Hereinafter, with reference to the accompanying drawings, the description will be made of the embodiment in accordance with the present invention.

(Embodiment 1)

Figure 1A:
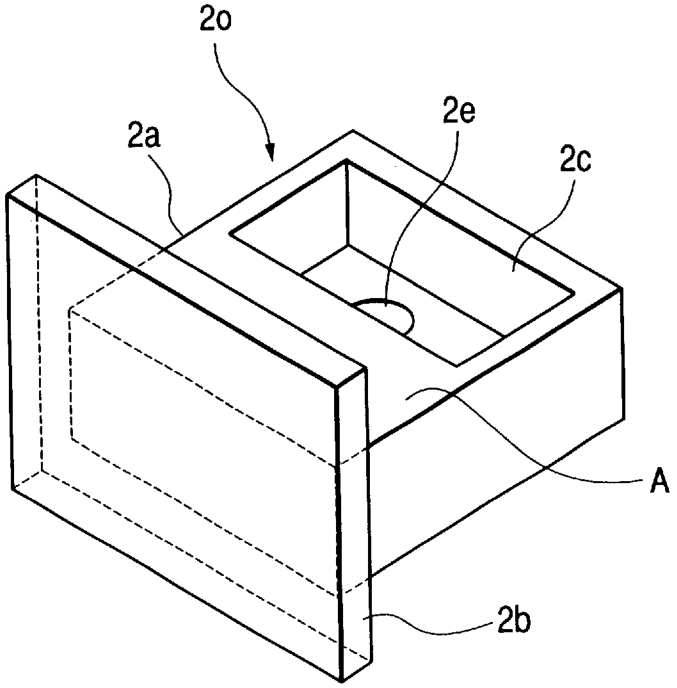
FIGS. 1A and 1B are perspective views which illustrate the ceiling plate of a liquid jet recording head to which the method for manufacturing liquid jet recording heads in accordance with the present invention.
Figure 1B:
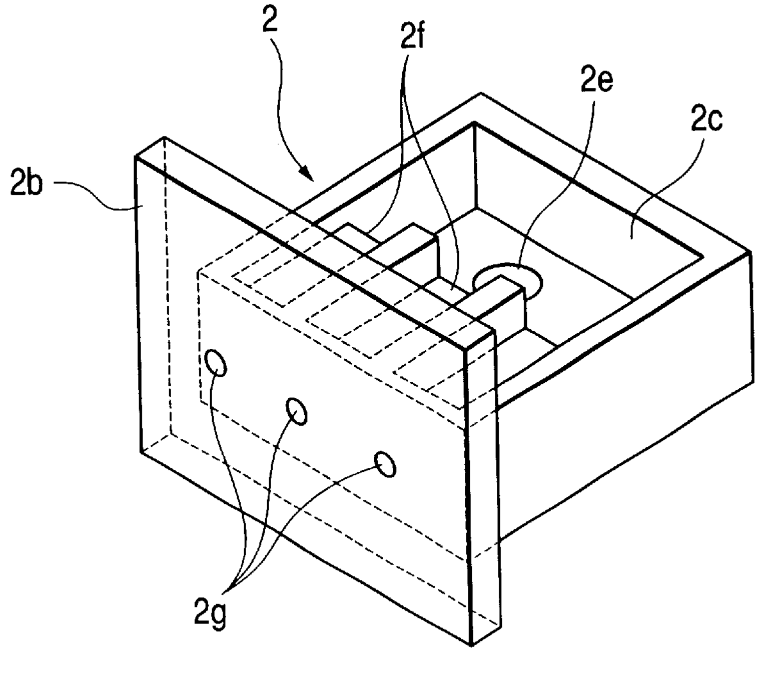

FIGS. 1A and 1B are perspective views which illustrate the ceiling plate of a liquid jet recording head to which the method for manufacturing liquid jet recording heads in accordance with the present invention is applied; FIG. 1A is a perspective view which shows the ceiling plate blank integrally formed by means of an injection molding or the like; FIG. 1B is a perspective view which shows the ceiling plate having the flow path grooves and the discharge ports formed by processing.

As shown in FIG. 1A, the ceiling plate blank 2*o* is provided with the main body portion 2*a* having the common liquid chamber 2*c* and the cylindrical protrusion (not shown) having the liquid supply opening 2*e* which is communicated with the common liquid chamber 2*c*, and also, with the discharge port plate 2*b*. This is a roughly molded resin product with these parts are integrally formed by known injection molding or the like. A plurality of flow path grooves 2*f* are processed by the irradiation of laser beam onto the flow path processing surface A of the ceiling blank 2*o*. The flow path grooves 2*f* thus processed are formed to be communicated with the common liquid chamber 2*c* as shown in FIG. 1B. After that, drilling is performed by the irradiation of laser beam to process and form a plurality of discharge ports 2*g* in the positions on the discharge port plate 2*b* corresponding to each of the flow path grooves 2*f* as shown in FIG. 1B. Then, the resin ceiling plate 2 thus processed is bonded to the elemental substrate provided with a plurality of electrothermal converting elements on its surface subsequent to having positioned the ceiling plate to the elemental substrate.

Figure 2:
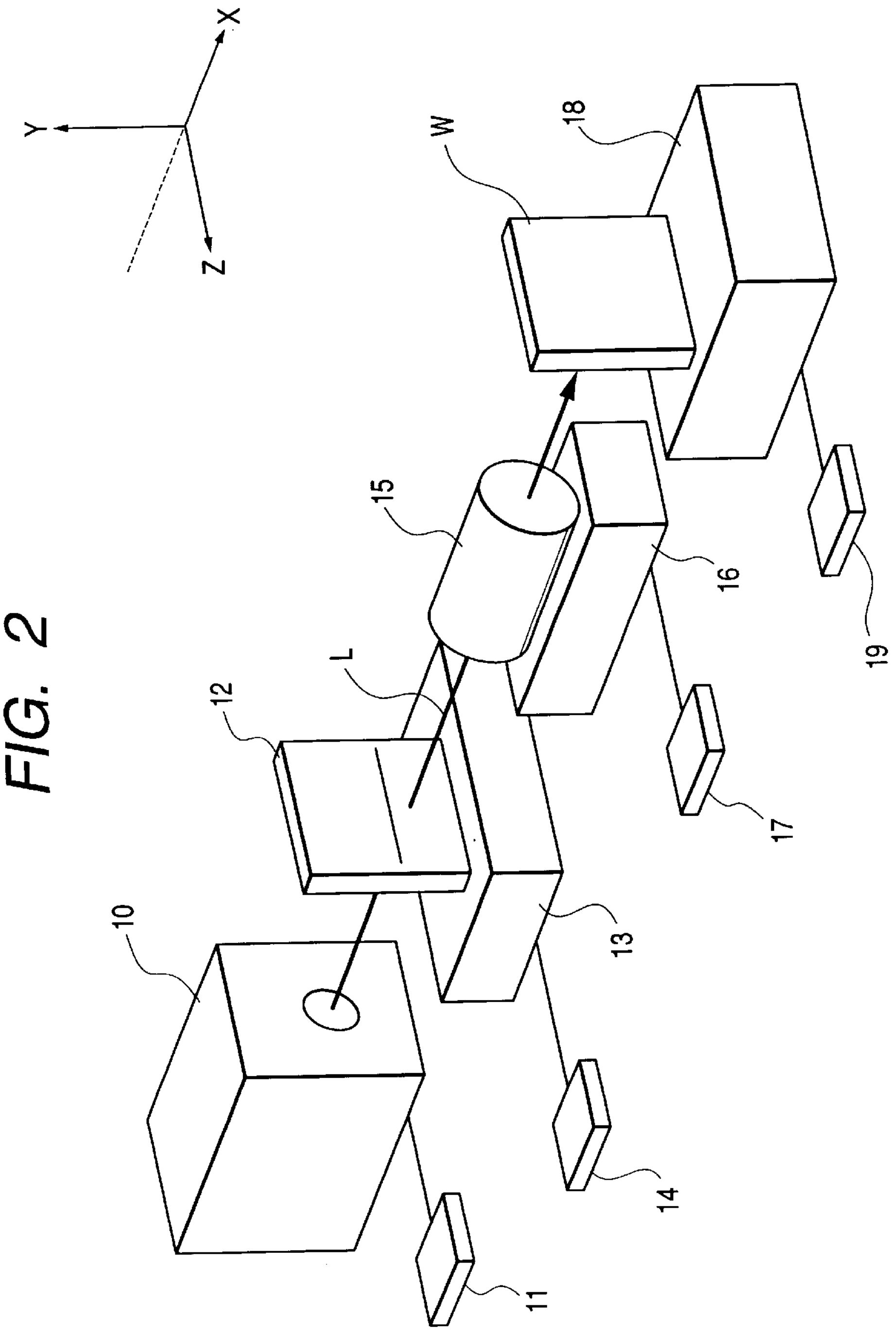
FIG. 2 is a view which schematically shows the structure of a laser processing apparatus to which the method for manufacturing liquid jet recording heads in accordance with the present invention.

Now, as shown in FIG. 2, the laser processing apparatus used for the aforesaid grooving and drilling comprises a laser oscillator 10 that serves as the light source to emit the laser beam L; a controller 11 that changes the oscillation voltages and oscillation frequencies of the laser beam L from the oscillator 10 for application; a mask 12 provided with the opening patterns for grooving and/or drilling; a movement driving device 13 that moves the mask 12 forward or backward (axis X) in the optical axis direction of the laser beam L, and then, in the directions of axes Y and Z, and a controller 14 that controls such movement; a projection optical system 15 that projects the opening patterns of the mask 12 onto the processing part of the ceiling plate 2 which is the work W to be processed; a rotation driving device 16 that rotates the projection optical system 15 around the optical axis of the laser beam L; and a controller 17 that controls such rotation. The ceiling plate 2 which is the work W to be processed is positioned within a plane (Y-Z plane) perpendicular to the optical axis (axis X) of the laser beam L by means of the movement stage 18 which is controlled by use of a controller 19. The movement driving device 13 of the mask 12 is provided with a driving mechanism using a stepping motor, a servo motor, or the like. Then, with the controller 14, it is possible to adjust the movement of the mask 12 in the arrangement direction (axis Y) of the opening patterns for use of grooving and/or drilling or in the rotational direction centering on the optical axis of the laser beam L in a precision of micron unit. Also, as to the movement of the mask 12, it is possible to select the continuous movement at a specific speed or the intermittent movements at specific intervals.

Also, by use of a computer or the like, it is possible to carry out the comprehensive control of the controllers 11, 14, 17, and 19 in order to control the laser oscillator 10 and each of the movement driving altogether.

The laser beam that has passed the mask 12, which is arranged for the formation of the liquid flow path grooves and of the discharge ports, performs its ablation on the ceiling plate, which is the work W, instantaneously. At this juncture, there is a need for the irradiation of laser beam in a higher energy concentration per hour in order to obtain grooves and holes in desired dimensions at desired pitches, and also, in order to make the discharge ports larger in a shorter period of processing time as possible. For example, if a processing is made with the laser beam energy concentration of $1J/cm^2$ per unit hour at the laser oscillation frequency of 200 Hz, it is possible to complete the processing of discharge ports having a large area by the irradiation of laser beam for several seconds.

With a laser processing apparatus of the kind, the laser beam is irradiated onto the resin blank of the ceiling plate. However, when the discharge ports are processed, the byproducts are created eventually.

Figure 3:
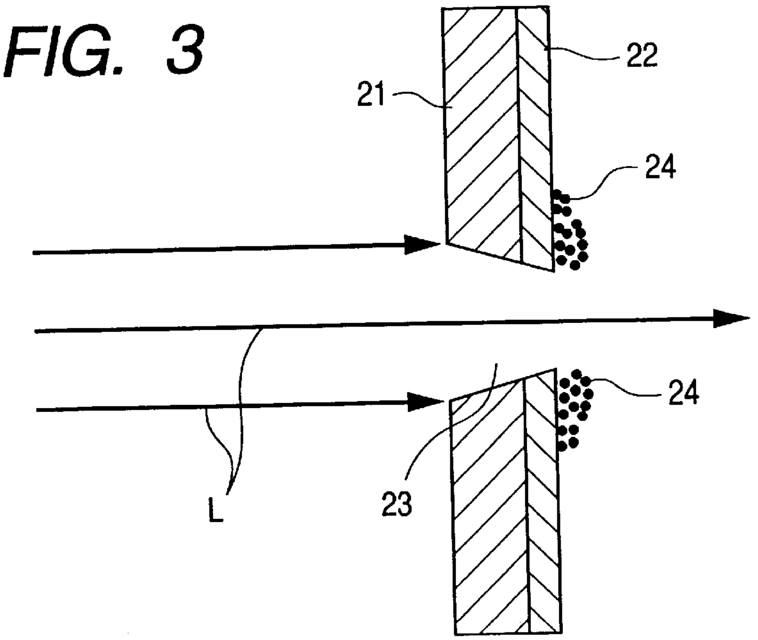
FIG. 3 is a view which schematically shows the processing mode of the discharge port plate of a ceiling plate to be processed in accordance with a first embodiment of the present invention.

FIG. 3 is an enlarged view which schematically shows the mode in which a discharge port is processed by the irradiation of laser beam onto the discharge port plate of the ceiling blank. Here, a reference mark L designates the laser beam that passes the opening pattern of the mask, and 21, the discharge port plate of the ceiling plate with the water-repellent layer 22 being formed on the liquid discharge surface side before the execution of laser processing. As the water-repellent agent, Cytop (Product name: manufactured by Asahi Glass K.K. ) is used. After the Cytop is applied to the discharge port plate 21, the water-repellent layer 22 is formed with heat treatment at 120° C. for one hour. A reference numeral 23 designates a discharge port formed by the laser processing, and 24, the byproducts adhering to the circumference of the discharge port 23 formed by the laser processing.

In accordance with the present invention, the laser beam L is incident upon the surface of the discharge port plate 21 where no water-repellent layer 22 is formed after having passed the mask. Then, the discharge port 23 is processed and formed by ablation made by the irradiation of laser beam. After that, a chemical surface modification process is given to the byproducts 24 created following the laser processing, which adhere to the surface where the water-repellent layer 22 is formed on the discharge port plate 21. Here, it is intended to suppress the increase of the surface energy of the ceiling plate blank due to the adhesion of the byproducts, thus characteristically preventing the blank surface from becoming hydrophilic. In this process, at the same time that the laser processing is performed, the chemical surface modification is given to the byproducts. Thus, there is no need for the provision of any additional step for the removal of the adhesive byproducts. The throughput of the product manufacture is enhanced accordingly, thus making it possible to implement the reduction of manufacture costs.

Figure 4:
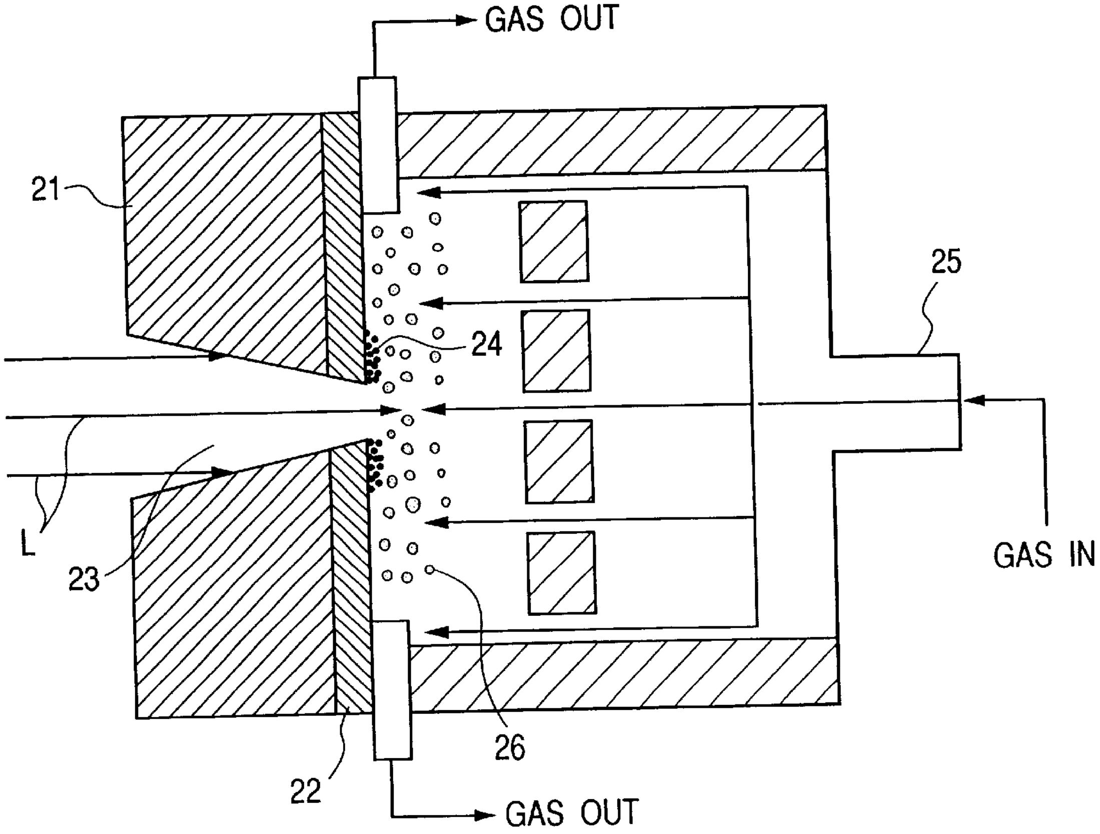
FIG. 4 is a view which schematically shows the processing mode of the discharge port plate of the ceiling plate to be processed in accordance with the first embodiment of the present invention.

Now, in conjunction with FIG. 4, the description will be made of the embodiment of a structure that forms the atmosphere that contains fluorine atom. Here, in FIG. 4, the same reference marks are applied to the same members and elements as those appearing in FIG. 3, and the description thereof will be omitted.

In accordance with the present embodiment, when the blank is processed by use of the laser processing apparatus shown in FIG. 2, the gaseous molecules 26 that contain fluorine atom in its structure are blown to the processing parts, thus forming the resin atmosphere that contains fluorine. Here, therefore, the nozzle 25 is arranged in the vicinity of the processing part in order to blow the gaseous molecules 26 having the fluorine atom in its structure. Then, when the discharge ports are processed by the irradiation of laser beam L, the gaseous molecules 26 that contain fluorine atom in its structure are blown out from the nozzle 25 to the processing parts. In this manner, part of the laser beam L irradiates the gaseous molecules 26 when used for processing. Then, by the energy of the laser beam L, the fluorine atom having a higher reaction is created from the gaseous molecules 26. By the highly reactive fluorine atom, the chemical surface modification is made on the byproducts that have been created by the irradiation of laser beam L. It is then attempted to fluorinate the surface of the byproducts. In this way, the chemical modification is performed on the surface of the byproducts that causes the surface energy to rise when adhering to the blank. The surface of the byproducts are thus fluorinated so as to suppress the phenomenon that may bring about the local hydrophilicity on the surface of the discharge port plate due to the adhesion of the byproducts. At the same time, this method enables the water-repellency of the related surface to be enhanced more than the conventional art.

In this respect, as the gaseous molecules that contain fluorine atom in its structure, it is possible to use tetrafluoromethane (its molecular formula: $CF_4$), for example. In other words, when the discharge ports are processed by the irradiation of laser beam, tetrafluoromethane is blown from the nozzle 25 onto the processing parts. Then, part of the laser beam L is irradiated onto tetrafluoromethane to enable it to create the highly reactive fluorine atom by means of the energy of laser beam L. With this highly reactive fluorine atom, the modification is chemically made on the surface of the byproducts 24, hence attempting to fluorinate the surface of the byproducts. Tetrafluoromethane is a stable gas in the air at the room temperature in its gaseous form. Its handling is easy so that it is easily introduced for use in the manufacture processes of liquid jet recording heads.

In this respect, it is preferable to continue the irradiation of laser beam even after the holes have been made thoroughly for the formation of discharge ports in order to fluorinate the surface of the byproducts. It is preferably suitable to continue the irradiation thereof for substantially the same period of time as it has taken to form the discharge ports.

Also, in order to unify the fluorination of each of the discharge ports, it is preferable to blow the gaseous molecules from the opposite side of the direction in which the laser beam is irradiated.

Here, in accordance with the present embodiment, the gas chamber is closely installed on the discharge port surface to blow gas so as to obtain the effect of the fluorination sufficiently at the room temperature under the atmospheric pressure.

With the ceiling plate thus processed and formed, the liquid jet recording head is manufactured, and mounted on a printer to record on a recording sheet with the observation given to the discharged liquid droplets. It is then confirmed that the discharge direction of flying droplets are stabilized with the result that prints are in a better condition as compared with the liquid jet recording head having the byproducts created at the time of discharge port formation but not given any chemical surface modification.

(Embodiment 2)

Figure 5:
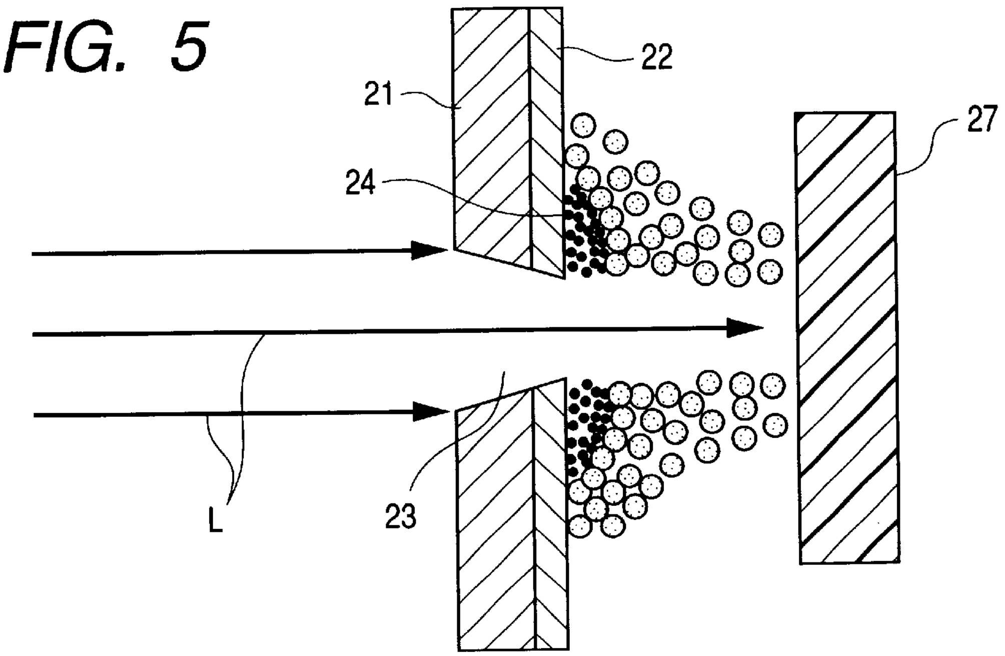
FIG. 5 is a view which schematically shows the processing mode of the discharge port plate of the ceiling plate to be processed in accordance with an embodiment of the present invention.

FIG. 5 is a view which schematically shows the processing mode of the discharge port plate of the ceiling plate processed in accordance with a second embodiment of the present invention. For the present embodiment, the resin having the fluorine atom in its structure is positioned extremely close to the processing part of the blank when it is processed by use of the laser processing apparatus shown in FIG. 2. Then, the laser beam L used for processing is irradiated onto the resin in order to apply the chemical surface modification treatment to the byproducts.

In FIG. 5, the same reference marks are applied to the same members and elements appearing in the previous embodiment. The description thereof will be omitted. Now, a reference numeral 27 designates the resin that contains the fluorine atom in its structure, which is positioned extremely close to the processing part of the blank. In the same manner as the previous embodiment, the water-repellent layer 22 is formed on the discharge port plate 21. The laser beam is incident upon from the surface where no water-repellent layer 22 is formed. Now, when the discharge ports are processed by the irradiation of laser beam L, part of the laser beam L for use of processing is irradiated onto the resin 27 positioned extremely close to the processing part, which contains the fluorine atom in its structure, so as to create highly reactive fluorine atom from the resin 27. With the highly reactive fluorine atom, the chemical surface modification is given to the byproducts created by the irradiation of laser beam L, thus implementing to fluorinate the surface of the byproducts. In this manner, the chemical surface modification is performed on the byproducts that adheres to the blank surface to raise the surface energy. In other words, the surface of the byproducts is fluorinated. Then, the surface of the discharge port plate is provided with the stabilized water-repellency, hence suppressing the occurrence of the phenomenon in which the hydrophilicity is locally created by the adhesion of the byproducts.

Further, by the irradiation of the laser beam L onto the resin 27 that contains fluorine atom in its structure, it becomes possible to partly polymerize the surface of the byproducts again by the resin using the energy of the laser beam L. In this way, the surface of the byproducts is further modified chemically to implement fluorinating the surface thereof.

In this respect, as the resin that contains fluorine atom in its structure, it is possible to use polytetrafluoroethylene, for example. In other words, when the discharge ports are processed by the irradiation of laser beam, polytetrafluoroethylene is positioned extremely close to the processing part of the blank. Then, part of the laser beam L is irradiated onto polytetrafluoroethylene to enable it to create the highly reactive fluorine atom. With this highly reactive fluorine atom, the modification is chemically made on the surface of the byproducts 24, hence attempting to fluorinate the surface thereof. Also, it is possible to implement fluorinating the surface of the byproducts by polymerizing polytetrafluoroethylene again on its surface. Now that polytetrafluoroethylene can be processed into solid in a sheet form at the room temperature under the atmospheric pressure, its handling and procurement are easy so that it is easily introduced for use in the manufacture processes of liquid jet recording heads.

Here, for the present embodiment, it is preferable to locate the resin that contains fluorine atom in its structure in a position on the discharge port surface with a gap of 1 mm or less in order to obtain the sufficient effect of fluorination at the room temperature under the atmospheric pressure.

With the ceiling plate thus processed and formed, the liquid jet recording head is manufactured, and mounted on a printer to record on a recording sheet with the observation given to the discharged liquid droplets. It is then confirmed that the discharge direction of flying droplets are stabilized with the result that prints are made in a better condition as compared with the liquid jet recording head having the byproducts created at the time of discharge port formation but not given any chemical surface modification.

(Embodiment 3)

Figure 6:
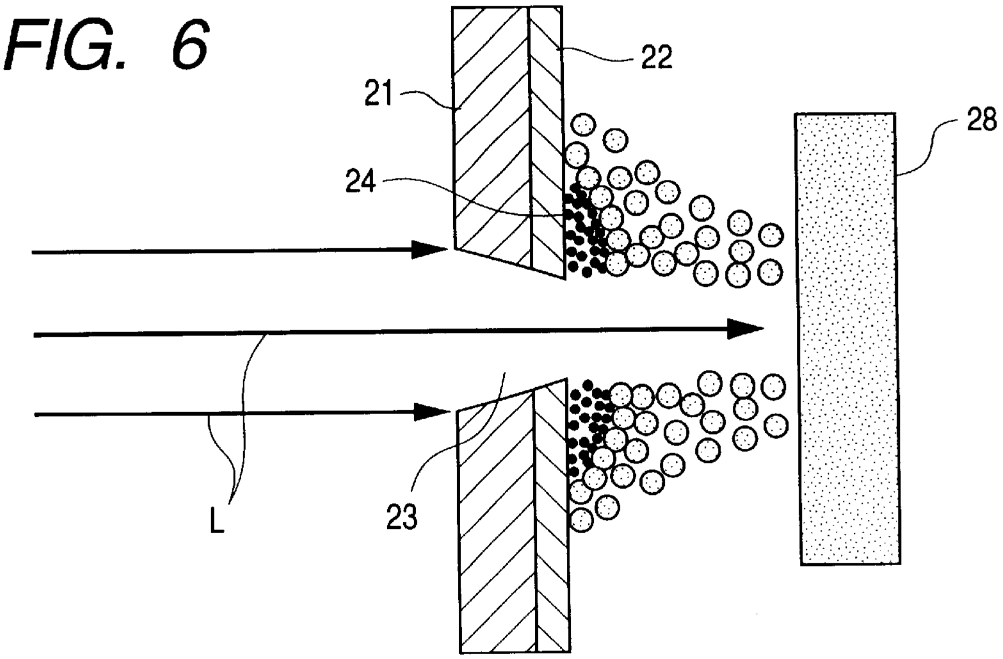
FIG. 6 is a view which schematically shows the processing mode of the discharge port plate of the ceiling plate to be processed in accordance with an embodiment of the present invention.
Figure 7:
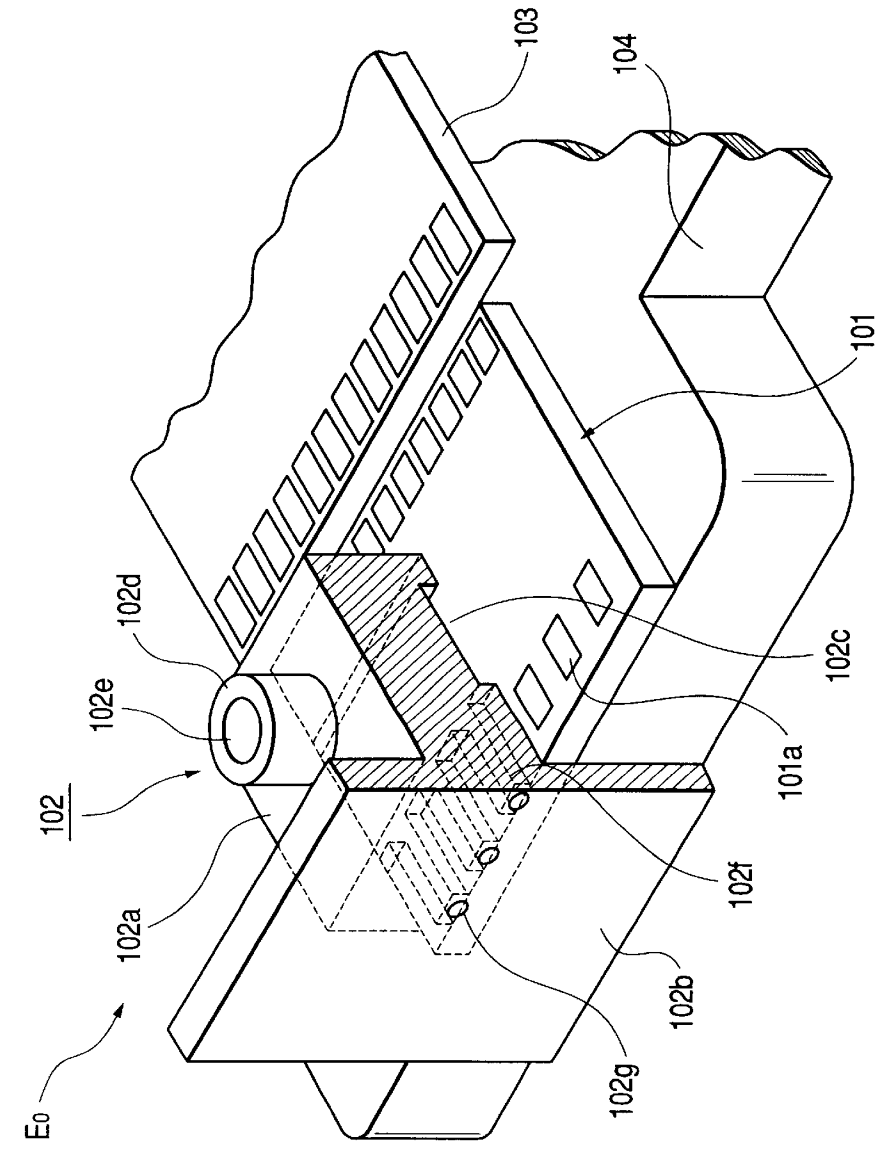
FIG. 7 is a perspective view which schematically shows the fundamental mode of a liquid jet recording head with the resin ceiling plate which is partially broken for representation.

FIG. 6 is a view which schematically shows the mode of processing the discharge port plate of the ceiling plate in accordance with a third embodiment of the present invention. For the present embodiment, when the blank is processed by use of the laser processing apparatus shown in FIG. 2, an absorbent, such as a sponge, that contains a solution having the polymer containing fluorine atom in its structure as solvent in the solution, is positioned extremely close to the processing part of the blank. The laser beam for use of processing is irradiated onto the absorbent to give the chemical surface modification to the byproducts of the laser processing.

In FIG. 6, the same reference marks are applied to the same members and elements appearing in the previous embodiment. The description thereof will be omitted. Now, a reference numeral 28 designates the absorbent that contains the solution having the polymer containing the fluorine atom in its structure as solvent in the solution, which is positioned extremely close to the processing part of the blank. In the same manner as the previous embodiment, the water-repellent layer 22 is formed on the discharge port plate 21. The laser beam is incident upon from the surface where no water-repellent layer 22 is formed. Now, when the discharge ports are processed by the irradiation of laser beam L, part of the laser beam L for use of processing is irradiated onto the absorbent 28 that contains polymer having fluorine atom in its structure as solvent in the solution, which is positioned extremely close to the processing part, so as to create highly reactive fluorine atom from the solution having fluorine atom in its structure, which is contained in the absorbent 28. With the highly reactive fluorine atom, the chemical surface modification is given to the byproducts created by the irradiation of laser beam L, thus implementing to fluorinate the surface of the byproducts. In this manner, the chemical surface modification is performed on the byproducts that adheres to the blank surface to raise the surface energy. In other words, the surface of the byproducts is fluorinated. Then, the surface of the discharge port plate is given the stabilized water-repellency, hence suppressing the occurrence of the phenomenon in which the hydrophilicity is locally created by the adhesion of the byproducts.

Further, it is possible to polymerize again the polymer with fluorine atom in its structure in the solution contained in the absorbent 28 on the surface of the byproducts. In this manner, the surface of the byproducts is further modified chemically, thus implementing fluorinating the surface thereof.

With the ceiling plate thus processed and formed, the liquid jet recording head is manufactured, and mounted on a printer to record on a recording sheet with the observation given to the discharged liquid droplets. It is then confirmed that the discharge direction of flying droplets is stabilized with the result that prints are in a better condition as compared with the liquid jet recording head having the byproducts created at the time of discharge port formation but not given any chemical surface modification.

For the present invention, it may be possible to combine the blowing of the gaseous molecules with the resin that contains fluorine atom in its structure or with the absorbent that contains the solution having polymer containing fluorine atom as solvent in the solution. In this case, by the synergic effect of gas and resin or gas and liquid, the chemical surface modification is given to the byproducts that raise the surface energy when adhering to the blank. In other words, the surface of the byproducts is fluorinated. Hence, the surface of the discharge port plate shows the stabilized water-repellency, making it possible to suppress the occurrence of the phenomenon in which the hydrophilicity is locally created by the adhesion of the byproducts.

With the ceiling plate thus processed and formed even in such a mode as described above, the liquid jet recording head is manufactured, and mounted on a printer to record on a recording sheet with the observation given to the discharged liquid droplets. It is then confirmed that the discharge direction of flying droplets are stabilized with the result that prints are in a better condition as compared with the liquid jet recording head having the byproducts created at the time of discharge port formation but not given any chemical surface modification.

(Embodiment 4)

For the present embodiment, the structure is the same as the first embodiment where the gaseous molecules, which contain fluorine atom in its structure, are blown to give the fluorine resin atmosphere to the discharge port plate on the side where the water-repellent layer is formed. However, the ablation processing is made in such a manner that an intermediate reactive substance that may easily react upon the laser beam is positioned extremely close to the processing part on the surface where the water-repellent layer is formed.

With the structure as described above, it becomes possible to allow the substance that contains fluorine to adhere efficiently to the surface where the water-repellent layer is formed.

In other words, usually, the absorptance of the gaseous molecules that contain fluorine atom in its structure (integer x, y that satisfy the fluorine contained substance CxFy: x=4y) is often smaller with respect to the laser beam. As a result, it cannot be expected that the excitation life of the fluorine contained substance CxFy, which is activated by the laser beam, is very long. For that matter, it is necessary to adopt a method whereby to make the irradiation period of the laser beam longer in order to obtain the adhesion of the fluorine resin in a sufficient amount.

In contrast, by the structure of the present embodiment, the laser beam is irradiated, while gas is blown in a state where the intermediately reactive substance M is arranged. Then, part of the laser beam thus irradiated enables the fluorine contained substance CxFy to be activated directly to create the active seeds CF, CF2, and CF3. These seeds react upon the surface of the discharge port plate to make the surface water-repellent.

At the same time, the laser beam is irradiated onto the intermediately reactive substance M. Then, the substance M* thus activated collides with the fluorine contained substance CxFy to develop the active seeds CF, CF2, and CF3. Here, the intermediately reactive substance M is the substance that can absorb the laser beam easily, and its active life is longer. As a result, there is an extremely high probability that this substance can collide with the fluorine contained substance CxFy. The active seeds CF, CF2, and CF3 thus formed react upon the surface of the discharge port plate as in the previous case. Here, the active substance M* that has collided with the fluorine contained substance CxFy loses its energy, and returns to the basic state of M.

Now, the aforesaid reactions are arranged in the following formula:

$$\begin{aligned} M + CxFy \rightarrow M^* + CxFy &\rightarrow M + xCF^* + (y - x)F^* \\ &\rightarrow M + xCF2^* + (y - 2x)F^* \\ &\rightarrow M + xCF3^* + (y - 3x)F^* \end{aligned}$$

In accordance with the structure of the present embodiment, it becomes possible to allow the fluorine contained substance to adhere efficiently to the formation surface of the water-repellent layer in this manner.

Here, for the present invention, the excimer laser is used for processing as a coherent laser source in order to process the discharge ports by means of ablation at a time by use of the laser processing apparatus shown in FIG. 2. Now, the description will be made of the excimer laser in this aspect. The excimer laser is the laser capable of oscillating ultraviolet beam. It has a good monochromaticity with a higher intensity, as well as a good directivity. Therefore, it can be oscillated in short pulses, and has an advantage, among many others, that when it is converged by use of lens, the energy concentration is made extremely great.

The excimer laser oscillator is an apparatus that can oscillate ultraviolet beam in short pulses (15 to 35 ns) by discharging the mixed gas of rare gas and halogen for its excitation, and often uses Kr-F laser, Xe-Cl laser, or Ar-F laser. The oscillated energy of such laser is several hundreds of mj/pulse, and the pulse repetition frequency is 30 to 1,000 Hz.

If high luminescence short pulse ultraviolet beam, such as excimer laser, is irradiated onto the surface of polymer resin, the ablative photodecomposition (APD) process takes place, and the irradiated portion is decomposed and dispersed instantaneously with the plasma lighting and impact noises to follow. In this way, polymer resin can be processed.

In comparing the precision of excimer laser processing with that of some other laser processing, if, for example, excimer laser, other YAG laser or $CO_2$ laser is irradiated onto a polyimide film, holes can be drilled by the application of KrF laser clearly, because the wavelength of polyimide that can absorb beam is in the UV region. However, although the YAG laser, which is not in the UV region, is still able to make holes, each of edge faces thereof becomes rough. The $CO_2$ laser, which is infrared beam, produces a creator around each of the holes it makes.

In accordance with the present invention, therefore, KrF laser, which is excimer laser beam, is used to process the discharge ports at a time by means of ablation. In this manner, it becomes possible to manufacture liquid jet recording heads capable of printing in high quality with the stabilized discharge directivity of flying droplets by the utilization of excellent characteristics of excimer laser when used for a processing of the kind.

Also, the present invention demonstrates an excellent effect with respect to the recording head and recording apparatus of the so-called ink jet recording type, which performs recording by forming flying droplets particularly by the utilization of thermal energy among those liquid jet recording methods.

Regarding the typical structure and operational principle of such method, it is preferable for the present invention to adopt those which can be implemented using the fundamental principle disclosed in the specifications of U.S. Pat. Nos. 4,723,129 and 4,740,796, for example. This method is applicable to the so-called on-demand type recording system and a continuous type recording system as well.

To briefly describe this recording method, discharge signals are supplied from a driving circuit to electrothermal transducing elements, which serve as discharge energy generating elements, disposed on a liquid (ink) retaining sheet or liquid path. In other words, in accordance with recording information, at least one driving signal is given in order to provide recording liquid (ink) with a rapid temperature rise so that film boiling phenomenon, which is beyond nuclear boiling phenomenon, is created in the liquid, thus generating thermal energy to cause film boiling on the thermoactive surface of the recording head. Since a bubble can be formed from the recording liquid (ink) by means of the driving signal given to an electrothermal converting element one to one, this method is effective particularly for the on-demand type recording method. By the development and contraction of the bubble, the liquid (ink) is discharged through each discharge port to produce at least one droplet. The driving signal is more preferably in the form of pulses because the development and contraction of the bubble can be effectuated instantaneously and appropriately. The liquid (ink) is discharged with quicker response. The driving signal in the form of pulses is preferably such as disclosed in the specifications of U.S. Pat. Nos. 4,463,359 and 4,345,262. In this respect, the temperature increasing rate of the thermoactive surface is preferably such as disclosed in the specification of U.S. Pat. No. 4,313,124 for an excellent recording in a better condition.

As the structure of the recording head, the present invention is effectively applicable to those which are shown in each of the above-mentioned specifications wherein the structure is arranged to combine the discharging openings, liquid paths, and the electrothermal converting elements (linear type liquid paths or right-angled liquid paths). Besides, it is equally and effectively applicable to the structure such as disclosed in the specifications of U.S. Pat. Nos. 4,558,333 and 4,459,600 in which the thermal activation portions are arranged in a curved area.

In addition, the present invention is effectively applicable to the structure disclosed in Japanese Patent Application Laid-Open No. 59-123670 wherein a common slit is used as the discharging ports for plural electrothermal transducing elements, and to the structure disclosed in Japanese Patent Application Laid-Open No. 59-138461 wherein an aperture for absorbing pressure waves of thermal energy is formed corresponding to the discharge ports.

Further, as a recording head for which the present invention can be utilized effectively, there is the full-line type recording head whose length corresponds to the maximum width of a recording medium recordable by such recording apparatus. For the full-line type recording head, it may be possible to adopt either a structure whereby to satisfy the required length by combining a plurality of recording heads or a structure arranged by one recording head integrally formed.

In addition, the present invention is effectively applicable to an exchangeable recording head of a chip type that can be electrically connected with the apparatus main body, the ink supply therefor being made possible from the apparatus main body, when mounted on the apparatus main body or to the use of a cartridge type recording head provided integrally for the recording head itself.

Also, it is preferable to additionally provide a recording head with recovery means and preliminarily auxiliary means because these additional means will contribute to making the effectiveness of a recording apparatus more stabilized. To name them specifically, these are capping means, cleaning means, suction or compression means, preheating means such as electrothermal converting elements or heating devices other than such transducing devices or the combination of those types of devices, and a predischarge means for performing discharge other than the regular discharge with respect to the recording head.

Also, as the recording modes of a recording apparatus, the present invention is not only applicable to a recording mode in which only one main color such as black is used for recording, but also, the invention is extremely effective in applying it to an apparatus having plural recording heads provided for use of at least one of multiple colors prepared by different colors or full-color prepared by mixing colors, irrespective of whether the recording heads are integrally structured or structured by a combination of plural recording heads.

In the embodiments of the present invention described above, while the ink has been described as liquid, it may be an ink material which is solidified below the room temperature but soften or liquefied at the room temperature or soften or liquefied within a temperature range of the temperature adjustment generally practiced for an ink jet recording, that is, not lower than 30° C. but not higher than 70° C. In other words, it should be good enough if only ink is liquefied at the time of giving recording signals for use. In addition, while positively preventing the temperature rise due to thermal energy by the use of such energy as an energy to be consumed for changing states of ink from solid to liquid, or by the use of the ink which will be solidified when left intact for the purpose of preventing the ink from being evaporated, it may be possible to adopt for the present invention the use of an ink having a nature of being liquefied only by the application of thermal energy, such as an ink capable of being discharged as ink liquid by enabling itself to be liquefied anyway when the thermal energy is given in accordance with recording signals, and an ink which will have already begun solidifying itself by the time it reaches a recording medium. In such a case, it may be possible to retain ink in the form of liquid or solid in the recesses or through holes of a porous sheet such as disclosed in Japanese Patent Application Laid-Open Nos. 54-56847 or 60-71260 in order to enable the ink to face the electrothermal converting elements. In the present invention, the most effective method for the various kinds of ink mentioned above is the one that enables the film boiling method to be effectuated as described above.

Furthermore, as the mode of the recording apparatus described above, it may be possible to adopt a copying apparatus combined with a reader, in addition to the image output terminal for a computer or other information processing apparatus. Also, for the recording apparatus described above, it may be possible to adopt a mode of a facsimile equipment provided with transmitting and receiving functions.

With the present invention structured as described above, it is possible to perform the chemical surface modification on real time on the byproducts which are created simultaneously when laser processing is effectuated in the formation process of the liquid discharge port on the resin ceiling plate or the like by means of laser beam drilling. In this way, it becomes possible to solve the problem encountered in the conventional art that the surface energy of the processed part of the ceiling plate is increased due to the adhesion of the byproducts, hence degrading the printing characteristics of a liquid jet recording head. The solution of this problem greatly contributes to the manufacture of liquid jet recording heads which demonstrate excellent printing characteristics.

Further, there is no need for the provision of any special processes in order to remove the byproducts adhering to the ceiling plate. Therefore, in the manufacture of liquid jet recording heads, it also becomes possible to solve the problem encountered in the conventional art that the product throughput is considerably lowered. With the solution of such problem, liquid jet recording heads can be manufactured at lower costs with a good product throughput.

What is claimed is:

1. A method for manufacturing a liquid jet recording head provided with a discharge port to discharge liquid and a discharge port plate having said discharge port by performing an ablation operation, the ablation operation being performed by projecting an image through a mask onto said discharge port plate, using a coherent laser beam as a light source, to form said discharge port, the method comprising the steps of:

forming a water-repellent layer on a first surface of said discharge port plate on a liquid discharge side; and performing said ablation operation by irradiating said laser beam towards a second, opposite surface of said discharge port plate while said first surface of said discharge port plate is exposed to an atmosphere containing at least one fluorine atom, to cause said discharge port to be formed and to cause a substance containing the at least one fluorine atom excited by said laser beam to adhere to the first surface having said water-repellent layer formed thereon.

2. A method for manufacturing a liquid jet recording head according to claim 1, wherein the atmosphere containing said at least one fluorine atom is formed by blowing a gaseous molecule containing the at least one fluorine atom onto said discharge port plate.

3. A method for manufacturing a liquid jet recording head according to claim 2, wherein said gaseous molecule is tetrafluoromethane.

4. A method for manufacturing a liquid jet recording head according to claim 2, wherein said gaseous molecule is blown from an opposite direction than that from which the laser beam is irradiated.

5. A method for manufacturing a liquid jet recording head according to claim 4, wherein said gaseous molecule is blown in a state of a chamber for use of blowing gas being closely in contact with the surface of said water-repellent layer formed thereon.

6. A method for manufacturing a liquid jet recording head according to claim 2, wherein said irradiation of the laser beam is performed in a state of a substance easily reacting upon said laser beam being arranged closely to said discharge port plate on a side of the first surface having said water-repellent layer formed thereon, and said laser beam is irradiated onto said substance easily reacting upon said laser beam through said discharge port to activate said substance, and then, said substance thus activated collides with said gaseous molecule to enable the substance containing fluorine to adhere in a state of being activated to the first surface having said water repellent layer formed thereon.

7. A method for manufacturing a liquid jet recording head according to claim 1, wherein the atmosphere containing said at least one fluorine atom is formed by arranging a resin containing the at least one fluorine atom closely to the first surface of said discharge port plate on the side of the surface having said water-repellent layer formed thereon, and by irradiating said laser beam onto the resin containing said at least one fluorine atom through a hole becoming said discharge port.

8. A method for manufacturing a liquid jet recording head according to claim 7, wherein said resin containing the at least one fluorine atom is polytetrafluoroethylene.

9. A method for manufacturing a liquid jet recording head according to claim 7, wherein a distance between said first surface having the water-repellent layer formed thereon and the resin containing the at least one fluorine atom is no greater than 1 mm.

10. A method for manufacturing a liquid jet recording head according to claim 1, wherein the atmosphere containing said at least one fluorine atom is formed by arranging an absorbent having a solution containing a polymer with the at least one fluorine atom in its structure as a solvent therein, closely to the first surface of said discharge port plate on the side of the surface having said water-repellent layer formed thereon, and by irradiating said laser beam onto the polymer contained in said absorbent through a hole becoming said discharge port.

11. A method for manufacturing a liquid jet recording head according to claim 10, wherein a distance between said first surface having the water-repellent layer formed thereon and the absorbent with the solution is no greater than 1 mm.

12. A method for manufacturing a liquid jet recording head according to claim 1, wherein the light source of said coherent laser beam is an ultraviolet laser.

13. A method for manufacturing a liquid jet recording head according to claim 12, wherein said ultraviolet laser is an excimer laser.

* * * * *

UNITED STATES PATENT AND TRADEMARK OFFICE
CERTIFICATE OF CORRECTION

PATENT NO. : 6,225,032 B1
DATED : May 1, 2001
INVENTOR(S) : Toshinori Hasegawa et al.

It is certified that error appears in the above-identified patent and that said Letters Patent is hereby corrected as shown below:

Colunm 2,
Line 8, "110*a*." should read -- 101*a*. --.

Column 15,
Line 29, "water repellent" should read -- water-repellent --.

Signed and Sealed this

Fifth Day of March, 2002

*Attest:*

JAMES E. ROGAN

*Attesting Officer*

*Director of the United States Patent and Trademark Office*